(12) United States Patent
Cho

(10) Patent No.: US 12,457,848 B2
(45) Date of Patent: Oct. 28, 2025

(54) DISPLAY DEVICE COMPRISING ADHESIVE LAYER COMPRISING MAGNESIUM COMPOUND AND YTTRIUM COMPOUND AND METHOD OF MANUFACTURING THE SAME

(71) Applicant: SAMSUNG DISPLAY CO., LTD., Yongin-si (KR)

(72) Inventor: Jonghwan Cho, Ansan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 491 days.

(21) Appl. No.: 17/961,269

(22) Filed: Oct. 6, 2022

(65) Prior Publication Data
US 2024/0121980 A1 Apr. 11, 2024

(30) Foreign Application Priority Data
Jan. 10, 2022 (KR) ........................ 10-2022-0003551

(51) Int. Cl.
*H10K 50/86* (2023.01)
*H10K 50/84* (2023.01)
*H10K 50/844* (2023.01)
*H10K 59/12* (2023.01)
*H10K 71/00* (2023.01)

(52) U.S. Cl.
CPC ........... *H10K 50/86* (2023.02); *H10K 50/841* (2023.02); *H10K 50/844* (2023.02); *H10K 71/00* (2023.02); *H10K 59/12* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 2018/0319704 A1* | 11/2018 | Adib | ..................... C04B 41/009 |
| 2020/0144333 A1* | 5/2020 | Kim | ..................... H10K 50/828 |
| 2023/0292576 A1* | 9/2023 | Cho | ..................... H10K 59/8792 |
| 2024/0213413 A1* | 6/2024 | Cho | ..................... H01L 25/0753 |

FOREIGN PATENT DOCUMENTS

| | | |
|---|---|---|
| KR | 10-2020-0004369 | 1/2020 |
| KR | 10-2020-0091484 | 7/2020 |
| KR | 10-2021-0049838 | 5/2021 |

* cited by examiner

*Primary Examiner* — Daniel Whalen
(74) *Attorney, Agent, or Firm* — F. CHAU & ASSOCIATES, LLC

(57) ABSTRACT

A display device having a substrate including a driving element and a light emitting element electrically connected to the driving element. A window layer is disposed on the substrate. A first adhesive layer is disposed on the window layer. The first adhesive layer includes a magnesium compound and an yttrium compound. A second adhesive layer is disposed on the first adhesive layer. A refractive layer is disposed on the second adhesive layer. The refractive layer includes a PFPE compound.

19 Claims, 6 Drawing Sheets

DISPLAY DEVICE COMPRISING ADHESIVE LAYER COMPRISING MAGNESIUM COMPOUND AND YTTRIUM COMPOUND AND METHOD OF MANUFACTURING THE SAME

CROSS-REFERENCE TO RELATED APPLICATION(S)

This application claims priority under 35 U.S.C. § 119 to Korean Patent Application No. 10-2022-0003551, filed on Jan. 10, 2022 in the Korean Intellectual Property Office, the disclosure of which is incorporated by reference in its entirety herein.

1. TECHNICAL FIELD

The present inventive concept relates generally to a display device displaying an image and a method of manufacturing the display device.

2. DISCUSSION OF RELATED ART

A display device is manufactured and used in various ways. The display device may provide visual information to the user by emitting light. The display device may include various light emitting materials for emitting light. For example, the display device may include a liquid crystal display device that emits light using a liquid crystal layer, an inorganic light emitting display device that emits light using an inorganic light emitting diode, and an organic light emitting display device that emits light using an organic light emitting diode, etc.

The display device may include a polarization layer to prevent reflection of external light. However, a thickness of the display device may increase due to the polarization layer, and the addition of the polarization layer may increase the cost for manufacturing the display device.

Accordingly, research is being conducted concerning a display device preventing reflection of external light without a polarization layer.

SUMMARY

Embodiments of the present inventive concept provide a display device displaying an image.

Embodiments of the present inventive concept provide a method of manufacturing the display device.

According to an embodiment of the present inventive concept, a display device may include a substrate including a driving element and a light emitting element electrically connected to the driving element. A window layer is disposed on the substrate. A first adhesive layer is disposed on the window layer. The first adhesive layer includes a magnesium compound and an yttrium compound. A second adhesive layer is disposed on the first adhesive layer. A refractive layer is disposed on the second adhesive layer. The refractive layer includes a PFPE compound.

According to an embodiment, the magnesium compound may include $MgF_2$ and $MgO$, and the yttrium compound comprises YOF.

According to an embodiment, YOF may have a cubic shape, a tetragonal shape, or a rhombohedral shape.

According to an embodiment, the second adhesive layer may include a substitutional solid solution of $SiO_2$ and $Al_2O_3$.

According to an embodiment, the substitutional solid solution may be $Si_9Al_2O_{10}$.

According to an embodiment, a refractive index of the first adhesive layer may be in a range of about 1.38 to about 1.40, a refractive index of the second adhesive layer may be in a range of about 1.46 to about 1.50, and a refractive index of the refractive layer may be in a range of about 1.30 to about 1.34.

According to an embodiment, a thickness of the first adhesive layer may be in a range of about 50 nm to about 150 nm, a thickness of the second adhesive layer may be in a range of about 5 nm to about 25 nm, and a thickness of the refractive layer may be in a range of about 5 nm to about 30 nm.

According to an embodiment, the display device may further include a color filter layer disposed between the substrate and the window layer, and an adhesion layer disposed between the color filter layer and the window layer.

According to an embodiment of the present inventive concept, a display device may include a substrate including a driving element and a light emitting element electrically connected to the driving element. A window layer is disposed on the substrate. A first adhesive layer is disposed on the window layer. The first adhesive layer includes $MgF_2$, $MgO$, and YOF. A second adhesive layer is disposed on the first adhesive layer. The second adhesive layer includes a substitutional solid solution of $SiO_2$ and $Al_2O_3$. A refractive layer is disposed on the second adhesive layer. The refractive layer includes a PFPE compound.

According to an embodiment, YOF may have a cubic shape, a tetragonal shape, or a rhombohedral shape.

According to an embodiment, the substitutional solid solution may be $Si_9Al_2O_{10}$.

According to an embodiment, a refractive index of the first adhesive layer may be in a range of about 1.38 to about 1.40, a refractive index of the second adhesive layer may be in a range of about 1.46 to about 1.50, and a refractive index of the refractive layer may be in a range of about 1.30 to about 1.34.

According to an embodiment, a thickness of the first adhesive layer may be in a range of about 50 nm to about 150 nm, a thickness of the second adhesive layer may be in a range of about 5 nm to about 25 nm, and a thickness of the refractive layer may be in a range of about 5 nm to about 30 nm.

According to an embodiment, the display device may further include a color filter layer disposed between the substrate and the window layer, and an adhesion layer disposed between the color filter layer and the window layer.

According to an embodiment of the present inventive concept, a method of manufacturing a display device may include forming a window layer on a substrate. The substrate includes a driving element and a light emitting element electrically connected to the driving element. A first adhesive layer is formed on the window layer. The first adhesive layer includes $MgF_2$, $MgO$, and YOF. A second adhesive layer is formed on the first adhesive layer. The second adhesive layer includes a substitutional solid solution formed by reacting $SiO_2$ and $Al_2O_3$. A refractive layer is formed on the second adhesive layer. The refractive layer includes a PFPE compound.

According to an embodiment, the forming of the first adhesive layer may include reacting $MgF_2$ and $Y_2O_3$.

According to an embodiment, the reacting of $MgF_2$ and $Y_2O_3$ may be performed at a temperature in a range of about 1150° C. to about 1250° C.

According to an embodiment, the reacting $MgF_2$ and $Y_2O_3$ may be performed at a temperature in a range of about 140° C. to about 160° C. by providing $O_2$ and Ar.

According to an embodiment, in the reacting of $MgF_2$ and $Y_2O_3$, $O_2$ may be provided at a flow rate in a range of about 5 SCCM to about 30 SCCM, and Ar may be provided at a flow rate in a range of about 5 SCCM to 30 SCCM.

According to an embodiment, the substitutional solid solution may be $Si_9Al_2O_{10}$, and the reacting $SiO_2$ and $Al_2O_3$ may be performed at a temperature in a range of about 1530° C. to about 1590° C.

According to an embodiment, a display device may include a substrate includes a driving element and a light emitting element electrically connected to the driving element, a window layer is disposed on the substrate, a first adhesive layer is disposed on the window layer, and including $MgF_2$, MgO, and YOF, a second adhesive layer is disposed on the first adhesive layer, and includes a substitutional solid solution of $SiO_2$ and $Al_2O_3$, and a refractive layer is disposed on the second adhesive layer, and includes a PFPE compound.

The first adhesive layer and the second adhesive layer may include a material having a relatively low refractive index. Accordingly, reflection of external light may be prevented. In addition, the first adhesive layer, the second adhesive layer and the refractive layer have relatively high strength, relatively high hardness, and relatively high durability. Accordingly, quality of the display device may be increased.

Also, when the first adhesion layer is formed during the manufacturing process of the display device, Ar and $O_2$ may act as catalysts, so that the first adhesion layer may be effectively formed.

It is to be understood that both the foregoing general description and the following detailed description are non-limiting examples and are intended to provide further explanation of the present inventive concept.

BRIEF DESCRIPTION OF THE DRAWINGS

The accompanying drawings are included to provide a further understanding of embodiments of the present inventive concept and are incorporated in and constitute a part of this specification together with the description.

DETAILED DESCRIPTION OF EMBODIMENTS

Illustrative, non-limiting embodiments will be more clearly understood from the following detailed description in conjunction with the accompanying drawings.

Figure 1:
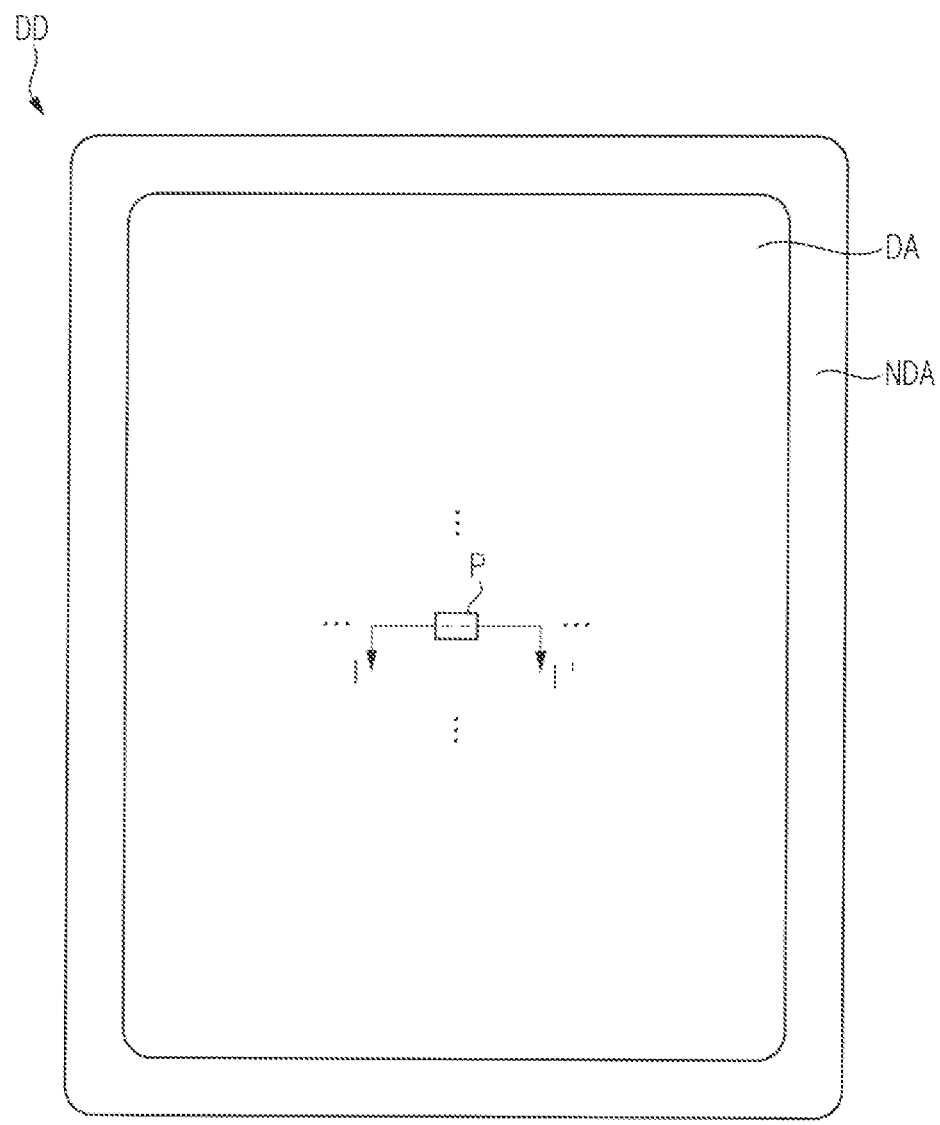
FIG. 1 is a plan view illustrating a display device according to an embodiment of the present inventive concept.

FIG. 1 is a plan view illustrating a display device according to an embodiment.

Referring to FIG. 1, a display device DD may include a display area DA and a non display area NDA. The display area DA may be defined as an area displaying an image, and the non display area NDA may be defined as an area in which an image is not displayed and which transmits a signal to display an image in the display area DA.

A plurality of pixels P may be disposed in the display area DA. The plurality of pixels P may be generally disposed in the display area DA. For example, in an embodiment the plurality of pixels P may be arranged in a matrix form in the display area DA. However, embodiments of the present inventive concept are not necessarily limited thereto. The plurality of pixels P may be arranged in various shapes in the display area DA.

The non display area NDA may surround the display area, as shown in FIG. 1. For example, in an embodiment, the non display area NDA may completely surround the display area DA. However, embodiments of the present inventive concept are not necessarily limited thereto. For example, the non display area NDA may be disposed adjacent to at least one side of the display area DA.

A plurality of driving parts may be disposed in the non display area NDA. For example, in an embodiment a gate driving part, a data driving part, an light emitting driving part, a power voltage generator, a driving controller, etc. may be disposed in the non display area NDA. The plurality of driving parts may transmit the signal to the plurality of pixels P. The plurality of pixels P may emit light based on the signal received from the plurality of driving parts.

Figure 2:
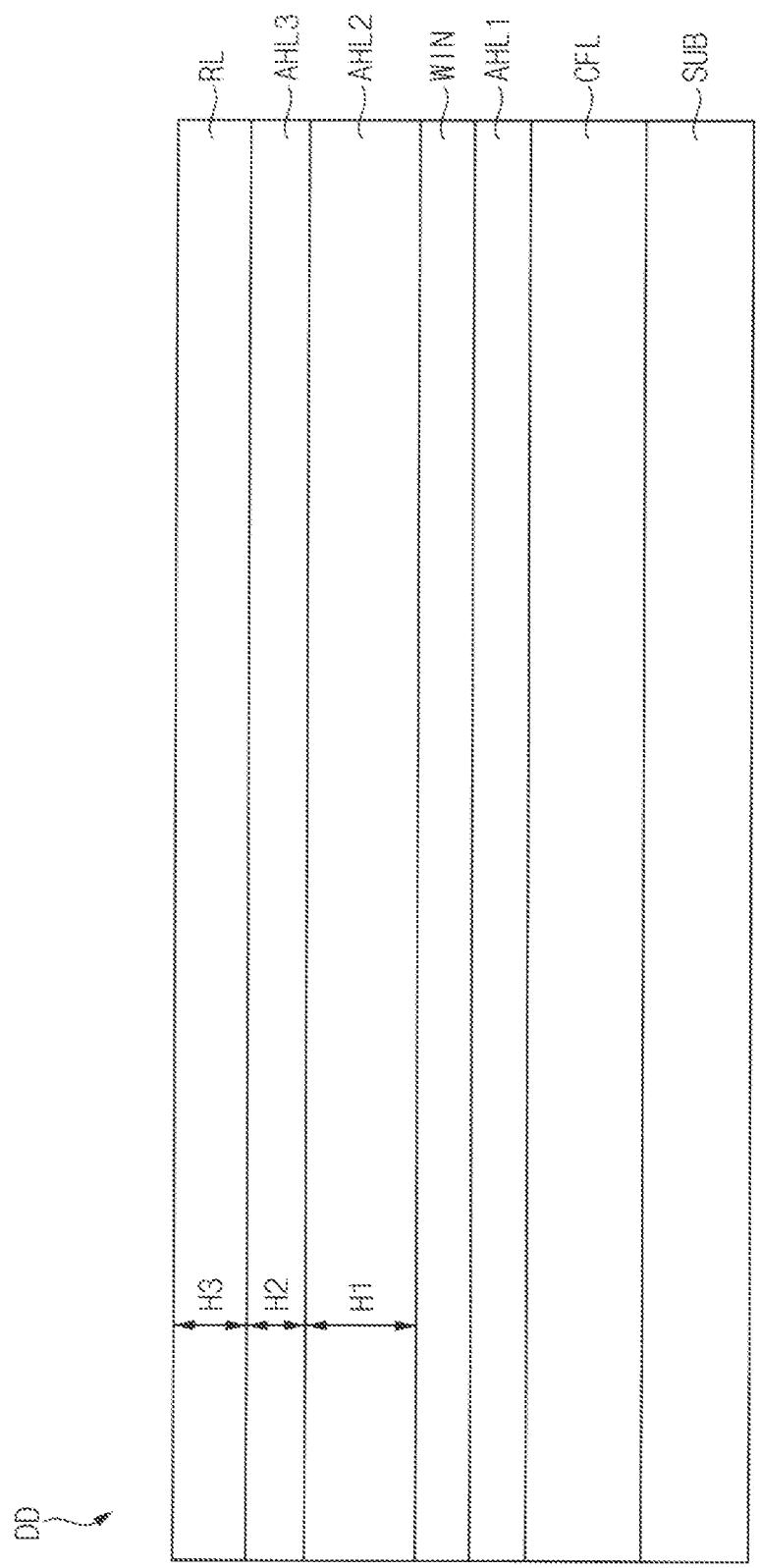
FIG. 2 is a cross-sectional view illustrating the display device of FIG. 1 according to an embodiment of the present inventive concept.

FIG. 2 is a diagram illustrating a structure of the display device of FIG. 1.

Referring to FIG. 1 and FIG. 2, the display device DD may include a substrate SUB, a color filter layer CFL, an adhesion layer AHL1, a window layer WIN, a first adhesive layer AHL2, a second adhesive layer AHL3, and a refractive layer RL.

In an embodiment, the substrate SUB may include a driving element and a light emitting element. The light emitting element may be electrically connected to the driving element. The light emitting element may emit light based on the signal transmitted by the driving element. The driving element may include a transistor and a capacitor. A detailed structure of the substrate SUB will be described later with reference to FIG. 3.

The color filter layer CFL may be disposed on the substrate SUB. The color filter layer CFL may filter the light emitted from the light emitting element. The color filter layer CFL may include a plurality of color filters. For example, in an embodiment the plurality of color filters may include a red color filter transmitting red light, a green color filter transmitting green light, and a blue color filter transmitting blue light. However, embodiments of the present inventive concept are not necessarily limited thereto and the color filters may filter and transmit various different colors.

The adhesion layer AHL1 may be disposed on the color filter layer CFL (e.g., disposed directly thereon). The adhesion layer AHL1 may be disposed between the color filter layer CFL and the window layer WIN (e.g., in a thickness direction of the display device DD), and may adhere the color filter layer CFL and the window layer WIN to each other. The adhesion layer AHL1 may include a material having adhesiveness. For example, in an embodiment the adhesion layer AHL1 may be any one of an optically clear adhesive film (OCA), optically clear resin (OCR), and a pressure sensitive adhesive film (PSA).

The window layer WIN may be disposed on the adhesion layer AHL1 (e.g., disposed directly thereon). The window layer WIN may cover a front surface of the display device DD. The window layer WIN may protect the display device DD from external force or penetration of impurities. The window layer WIN may include a transparent material. For example, in an embodiment the window layer WIN may include glass or plastic.

Since the display device DD according to an embodiment does not include a polarization layer, additional components may be disposed on the window layer WIN for reducing reflection of external light occurring outside of the window layer WIN. The reflection of external light occurring outside of the window layer WIN may be referred to as an external surface reflection of the window layer WIN. Hereinafter, the additional components for reducing the external surface reflection of the window layer WIN may be described.

The first adhesive layer AHL2 may be disposed on the window layer WIN (e.g., disposed directly thereon). In an embodiment, the first adhesive layer AHL2 may include a magnesium compound and an yttrium compound. In an embodiment, the magnesium compound may include $MgF_2$ and MgO, and the yttrium compound may include YOF. YOF may have a cubic shape, tetragonal shape, or rhombohedral shape. For example, in an embodiment, the first adhesive layer AHL2 may be a single-layer structure in which $MgF_2$, MgO, and YOF are mixed.

The first adhesive layer AHL2 may reduce the external surface reflection of the window layer WIN due to low refractive indices of the magnesium compound and the yttrium compound. In an embodiment, a refractive index of the first adhesive layer AHL2 may be in a range of about 1.36 to about 1.42 based on light having visible wavelength range. For example, the refractive index of the first adhesive layer AHL2 may be in a range of about 1.38 to about 1.40 based on light having a wavelength of about 550 nm. In an embodiment, a thickness H1 of the first adhesive layer AHL2 may be in a range of about 50 nm to about 150 nm. The refractive index of the first adhesive layer AHL2 may be lower than a refractive index of the second adhesive layer AHL3. Accordingly, the external surface reflection of the window layer WIN may be effectively reduced. In an embodiment, the thickness of the first adhesive layer AHL2 may be greater than a thickness of the second adhesive layer AHL3.

A contact angle of the first adhesive layer AHL2 with respect to water may be in a range of about 106 degrees to about 117 degrees. For example, initially the contact angle of the first adhesive layer AHL2 may be about 117 degrees, but, the contact angle of the first adhesive layer AHL2 may be lowered by external impacts. In an embodiment in which the first adhesive layer AHL2 included only the $MgF_2$, the contact angle of the first adhesive layer AHL2 was about 102 degrees after an eraser abrasion resistance test of about 10,000 times. In an embodiment in which the first adhesive layer AHL2 included $MgF_2$, MgO, and YOF, the contact angle of the first adhesive layer AHL2 was about 106 degrees after the eraser abrasion resistance test of about 10,000 times. The eraser in these tests was an industrial eraser manufactured by Munbang Sau. For example, the first adhesive layer AHL2 according to an embodiment of the present inventive concept may prevent the external surface reflection, and may increase color realization, and may have a relatively high durability.

The second adhesive layer AHL3 may be disposed on the first adhesive layer AHL2 (e.g., disposed directly thereon). In an embodiment, the second adhesive layer AHL3 may be formed by reacting a silicon compound and an aluminum compound with each other. In an embodiment, the second adhesive layer AHL3 may include substitutional solid solution obtained by reacting the silicon compound and the aluminum compound with each other. For example, in an embodiment the substitutional solid solution may be a substitutional solid solution of $SiO_2$ and $Al_2O_3$. For example, the substitutional solid solution may be $Si_9Al_2O_{10}$. The substitutional solid solution may have a stable chemical bond, and may be coated stably, and may form a high density thin film.

The second adhesive layer AHL3 may firmly attach the first adhesive layer AHL2 and the refractive layer RL to each other. In an embodiment, the refractive index of the second adhesive layer AHL3 may be in a range of about 1.44 to about 1.52 based on light having visible wavelength range. For example, the refractive index of the second adhesive layer AHL3 may be in a range of about 1.46 to about 1.50 based on light having a wavelength of about 550 nm. In an embodiment, the thickness H2 of the second adhesive layer AHL3 may be in a range of about 5 nm to about 25 nm.

The refractive layer RL may be disposed on the second adhesive layer AHL3 (e.g., disposed directly thereon). In an embodiment, the refractive layer RL may have relatively high anti-fingerprint properties and slip properties. In an embodiment, a refractive index of the refractive layer RL may be in a range of about 1.28 to about 1.36 based on light having a visible wavelength range. For example, the refractive index of the refractive layer RL may be in a range of about 1.30 to about 1.34 based on light having a wavelength of about 550 nm. The refractive layer RL may have a relative low refractive index, and may suppress surface abrasion. In an embodiment, the refractive layer RL may include a perfluoropolyether (PFPE) compound. The PFPE compound may have a structure in which an ether bond having high flexibility is introduced into a perfluoroalkyl chain. A thickness H3 of the refractive layer RL may be in a range of about 5 nm to about 30 nm.

As described above, in the display device DD according to embodiments, layers having a relatively low refractive index are disposed on the window layer WIN (e.g., above the window layer WIN). Accordingly, the external surface reflection of the window layer WIN may be substantially reduced or prevented.

However, the structure described with reference to FIG. 2 is non-limiting, and layers including materials having a refractive index higher than each of the layers AHL2, AHL3, and RL may be additionally disposed between the layers AHL2, AHL3, and RL. In this embodiment, effects such as prevention of the external light reflection and increased color realization may be obtained due to the layers having a relatively low refractive index and the layers having a relatively high refractive index.

Figure 3:
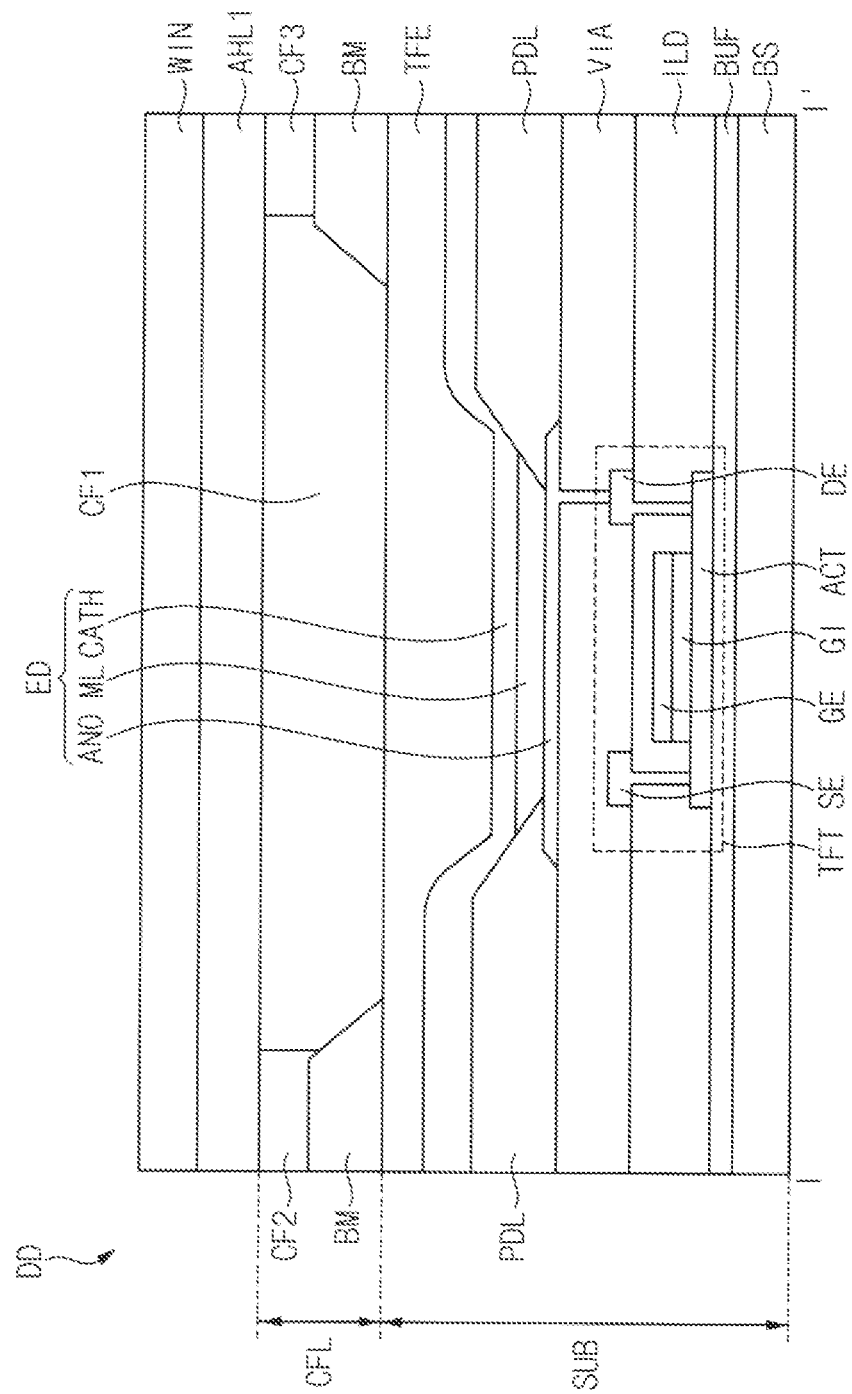
FIG. 3 is a cross-sectional view taken along a line I-I' of FIG. 1 according to an embodiment of the present inventive concept.

FIG. 3 is a cross-sectional view taken along a line I-I of FIG. 1. FIG. 3 may be a diagram schematically illustrating an example of a structure of the substrate SUB and the color filter layer CFL. Also, FIG. 3 may be a diagram illustrating a structure of the display device DD in which the polarization layer is not included. Accordingly, a description of components disposed on the window layer WIN will be omitted.

Referring to FIG. 1 and FIG. 3, the display device DD may include a base substrate BS, a buffer layer BUF, a gate insulation layer GI, an interlayer insulation layer ILD, a transistor TFT, a via insulation layer VIA, a pixel defining layer PDL, a light emitting element ED, an encapsulation layer TFE, a black matrix BM, a first color filter CF1, a second color filter CF2, a third color filter CF3, the adhesion layer AHL1, and the window layer WIN.

In an embodiment, the transistor TFT may include an active layer ACT, a gate electrode GE, a source electrode SE, and a drain electrode DE. The transistor TFT may be referred to as the driving element. In an embodiment, the light emitting element ED may include an anode electrode ANO, a middle layer ML, and a cathode electrode CATH.

In an embodiment, the base substrate BS may include glass or plastic. In an embodiment in which the base substrate BS includes glass, a rigidity of the base substrate BS may be relatively high. However, even if the base substrate BS includes glass, the base substrate BS may have ductility by patterning. In an embodiment in which the base substrate BS includes plastic, the base substrate BS may have ductility. An example of the plastic may be polyimide. In addition to this, the base substrate BS may include various materials.

The buffer layer BUF may be disposed on the base substrate BS (e.g., disposed directly thereon). In an embodiment, the buffer layer BUF may include an inorganic insulation material. For example, in an embodiment the inorganic insulation material may be $SiO_x$, $SiN_x$, SiON, etc. These compounds may be used alone or in combination with each other. The buffer layer BUF may prevent metal atoms or impurities from diffusing into the active layer ACT. Also, the buffer layer BUF may control the rate of heat provided to the active layer ACT during a crystallization process for forming the active layer ACT.

The active layer ACT may be disposed on the buffer layer BUF (e.g., disposed directly thereon). In an embodiment, the active layer ACT may include a silicon semiconductor. For example, the silicon semiconductor may be amorphous silicon, polycrystalline silicon, etc. However, embodiments of the present inventive concept are not necessarily limited thereto. For example, in an embodiment the active layer ACT may include an oxide semiconductor, such as IGZO, IGO, IZO, etc.

The gate insulation layer GI may be disposed on the active layer ACT (e.g., disposed directly thereon). The gate insulation layer GI may overlap only a portion of the active layer ACT or may cover the active layer ACT and may be disposed on the buffer layer BUF (e.g., disposed directly thereon). The gate insulation layer GI may include an inorganic insulation material. For example, in an embodiment the inorganic insulation material may be $SiO_x$, $SiN_x$, SiON, etc. These may be used alone or in combination with each other.

The gate electrode GE may be disposed on the gate insulation layer GI. In an embodiment, the gate electrode GE may include metal, alloy, metal oxide, transparent conductive material, etc. For example, the material included in the gate electrode GE may be Ag, alloy including AG, Mo, alloy including Mo, Al, alloy including Al, AlN, W, WN, Cu, Ni, Cr, CrN, Ti, Ta, Pt, Sc, ITO, IZO, etc. These compositions may be used alone or in combination with each other.

The interlayer insulation layer ILD may be disposed on the buffer layer BUF (e.g., disposed directly thereon) to cover the gate electrode GE and the active layer ACT. The interlayer insulation layer ILD may include an inorganic insulation material. For example, in an embodiment the inorganic insulation material may be $SiO_x$, $SiN_x$, SiON, etc. These compositions may be used alone or in combination with each other.

The source electrode SE and the drain electrode DE may be disposed on the interlayer insulation layer ILD (e.g., disposed directly thereon). The source electrode SE and the drain electrode DE may be connected to the active layer ACT through contact holes. In an embodiment, the source electrode SE and the drain electrode DE may include metal, alloy, metal oxide, transparent conductive material, etc. For example, the material included in the source electrode SE and the drain electrode DE may be Ag, alloy including Ag, Mo, alloy including Mo, Al, alloy including Al, AlN, W, WN, Cu, Ni, Cr, CrN, Ti, Ta, Pt, Sc, ITO, IZO, etc. These compositions may be used alone or in combination with each other. The source electrode SE and the drain electrode DE may be electrically connected to each other based on a signal applied to the gate electrode GE.

The via insulation layer VIA may be disposed on the interlayer insulation layer ILD (e.g., disposed directly thereon) to cover the source electrode SE and the drain electrode DE. In an embodiment, the via insulation layer VIA may include an organic insulation material. For example, the organic insulation material may be a photoresist, polyacrylic resin, polyimide resin, acrylic resin, etc. These materials may be used alone or in combination with each other. In an embodiment, the display device DD may further include a passivation layer disposed between the via insulation layer VIA and the interlayer insulation layer ILD (e.g., in a thickness direction of the display device DD).

The anode electrode ANO may be disposed on the via insulation layer VIA. The anode electrode ANO may be connected to the drain electrode through a contact hole. In an embodiment, the anode electrode ANO may include metal, metal oxide, metal nitride, etc. For example, in an embodiment the metal may be Ag, Mo, Al, W, Cu, Ni, Cr, Ti, Ta, Pt, Sc, etc. These compositions may be used alone or in combination with each other. In an embodiment, the metal oxide may be ITO, IZO, etc. These compositions may be used alone or in combination with each other. In an embodiment, the metal nitride may be AlN, WN, CrN, etc. These compositions may be used alone or in combination with each other.

The pixel defining layer PDL may be disposed on the via insulation layer VIA (e.g., disposed directly thereon). The pixel defining layer PDL may define an opening exposing the anode electrode ANO. For example, in an embodiment, the opening defined by the pixel defining layer PDL may expose a central portion of the anode electrode ANO (e.g., in a horizontal directional parallel to an upper surface of the base substrate BS). In an embodiment, the pixel defining layer PDL may include an organic insulation material.

The middle layer ML may be disposed on the anode electrode. The middle layer ML may include an organic material emitting light of a preset color. For example, in an embodiment the middle layer may include an organic material emitting blue light. In this embodiment, the middle layer ML may have a structure in which a plurality of blue organic light emitting layers are stacked. For example, the middle layer ML may have a structure in which three blue organic light emitting layer are stacked. However, embodiments of the present inventive concept are not necessarily limited thereto.

For example, in an embodiment, the middle layer ML may have a structure in which a plurality of blue organic light emitting layers and an organic light emitting layer emitting light of different color are stacked. For example, the middle layer ML may have a structure in which three blue organic emitting layers and one green organic light emitting layer are stacked.

The cathode electrode CATH may be disposed on the middle layer ML. In an embodiment, the cathode electrode CATH may include metal, metal oxide, metal nitride, etc. For example, in an embodiment the metal may be Ag, Mo, Al, W, Cu, Ni, Cr, Ti, Ta, Pt, Sc, etc. These compositions may be used alone or in combination with each other. In an embodiment, the metal oxide may be ITO, IZO, etc. These compositions may be used alone or in combination with each other. In an embodiment, the metal nitride may be AlN, WN, CrN, etc. These compositions may be used alone or in combination with each other.

A cross-sectional structure of the display device DD described with reference to FIG. 3 may be an example. However, embodiments of the present inventive concept are not necessarily limited thereto. For example, the display device DD may further include a plurality of conductive layers. A conductive layer may be further disposed between the base substrate BS and the buffer layer BF (e.g., in a thickness direction of the display device DD). The display device DD may further include a conductive layer disposed between the gate electrode GE and the source electrode SE (e.g., in a thickness direction of the display device DD). Also, the display device may further include a color conversion layer disposed between the encapsulation layer TFE and the color filter layer CFL (e.g., in a thickness direction of the display device DD).

Figure 4:
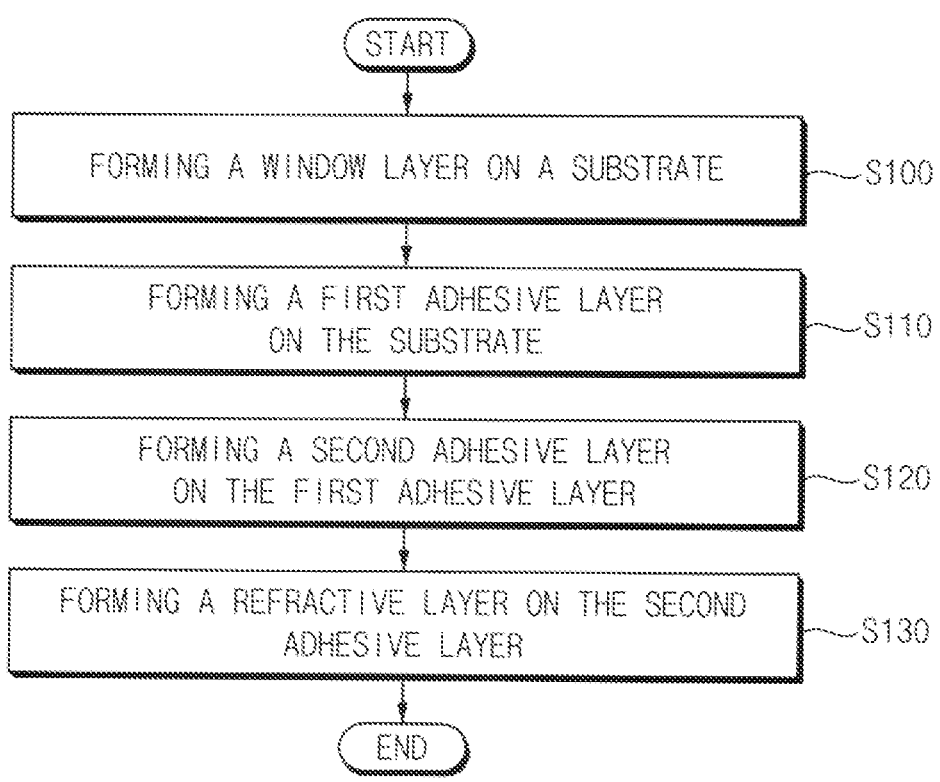
FIG. 4 is a flowchart illustrating a method of manufacturing the display device of FIG. 1 according to an embodiment of the present inventive concept.

FIG. 4 is a flowchart illustrating a method of manufacturing the display device of FIG. 1.

Referring to FIGS. 1 and 4, the window layer WIN may be formed on the substrate SUB in block S100. The substrate SUB may include the driving element and the light emitting element connected to the driving element. The color filter layer CFL may be formed between the window layer WIN and the substrate SUB, and the window layer WIN may be attached to the color filter layer CFL by the adhesion layer AHL1 disposed on the color filter layer CFL.

The first adhesive layer AHL2 may be formed on the window layer WIN in block S110. In an embodiment, the first adhesive layer AHL2 may include the magnesium compound and the yttrium compound. In an embodiment, the magnesium compound may include $MgF_2$ and MgO, and the yttrium compound may include YOF. YOF may have a cubic shape, tetragonal shape, or rhombohedral shape. For example, the first adhesive layer AHL2 may be a single-layer structure in which $MgF_2$, MgO, and YOF are mixed.

When $MgF_2$ and $Y_2O_3$ react, $MgF_2$, MgO, and YOF may be produced. In an embodiment, the reaction may be performed at a temperature in a range of about 1150° C. to about 1250° C. or less, and the reaction may be performed under pressure of about 10 mmHg.

In addition, when Ar and $O_2$ are provided, the reaction may be performed at a temperature in a range of about 140° C. to about 160° C. In an embodiment, $O_2$ may be provided at a flow rate in a range of about 5 SCCM (standard cc per minute) to about 30 SCCM, and Ar may be provided at a flow rate in a range of about 5 SCCM to about 30 SCCM. Ar and $O_2$ may help deposition of the first adhesive layer AHL2 by increasing kinetic energy of deposited particles in the process of forming the first adhesive layer AHL2.

The first adhesive layer AHL2 may reduce the external surface reflection of the window layer WIN due to low refractive indices of the magnesium compound and the yttrium compound. A refractive index of the first adhesive layer AHL2 may be in a range of about 1.36 to about 1.42 based on light having a visible wavelength range. A thickness H1 of the first adhesive layer AHL2 may be in a range of about 50 nm to about 150 nm. The refractive index of the first adhesive layer AHL2 may be lower than a refractive index of the second adhesive layer AHL3, accordingly, the external surface reflection may be effectively reduced. In this embodiment, the thickness of the first adhesive layer AHL2 may be greater than a thickness of the second adhesive layer AHL3.

A contact angle of the first adhesive layer AHL2 with respect to water may be in a range of about 106 degrees to about 117 degrees. In an embodiment, the contact angle of the first adhesive layer AHL2 may initially be about 117 degrees, but may be lowered by external impacts. In an embodiment in which the first adhesive layer AHL2 includes only the $MgF_2$, the contact angle of the first adhesive layer AHL2 was about 102 degrees after an eraser abrasion resistance test of about 10,000 times. In an embodiment in which the first adhesive layer AHL2 includes $MgF_2$, MgO, and YOF, the contact angle of the first adhesive layer AHL2 was about 106 degrees after the eraser abrasion resistance test of about 10,000 times. In the tests, the eraser was an industrial eraser manufactured by Munbang Sau. For example, the first adhesive layer AHL2 according to an embodiment of the present inventive concept may substantially reduce or prevent the external surface reflection of the window layer WIN, and may provide increased color realization, and may have relatively high durability.

The second adhesive layer AHL3 may be formed on the first adhesive layer AHL2 in block S120. The second adhesive layer AHL3 may be formed by reacting the silicon compound and the aluminum compound with each other. In an embodiment, the second adhesive layer AHL3 may include substitutional solid solution obtained by reacting the silicon compound and the aluminum compound with each other. For example, the substitutional solid solution may be a substitutional solid solution of $SiO_2$ and $Al_2O_3$, or may be a $Si_9Al_2O_{10}$. The substitutional solid solution may have a stable chemical bond, and may be coated stably, and may form a high density thin film.

In an embodiment, the substitutional solid solution may be formed by reacting $SiO_2$ and $Al(OH)_3$. The reaction may be performed at a temperature in a range of about 1530° C. to about 1590° C. In this embodiment, MgO and $Y_2O_3$ may be used as catalyst.

The second adhesive layer AHL3 may firmly attach the first adhesive layer AHL2 and the refractive layer RL to each other. In an embodiment, the refractive index of the second adhesive layer AHL3 may be in a range of about 1.44 to about 1.52 based on light having a visible wavelength range. For example, the refractive index of the second adhesive layer AHL3 may be in a range of about 1.46 to about 1.50 based on light having a wavelength of about 550 nm. The thickness H2 of the second adhesive layer AHL3 may be in a range of about 5 nm to about 25 nm.

The refractive layer RL may be formed on the second adhesive layer AHL3 (e.g., directly thereon) in block S130. In an embodiment, the refractive layer RL may have relative high anti-fingerprint properties and slip properties. The refractive layer RL may have a relative low refractive index, and may suppress surface abrasion. In this embodiment, the refractive layer RL may include a PFPE compound. The PFPE compound may have a structure in which an ether bond having high flexibility is introduced into a perfluoro-alkyl chain.

Figure 5:
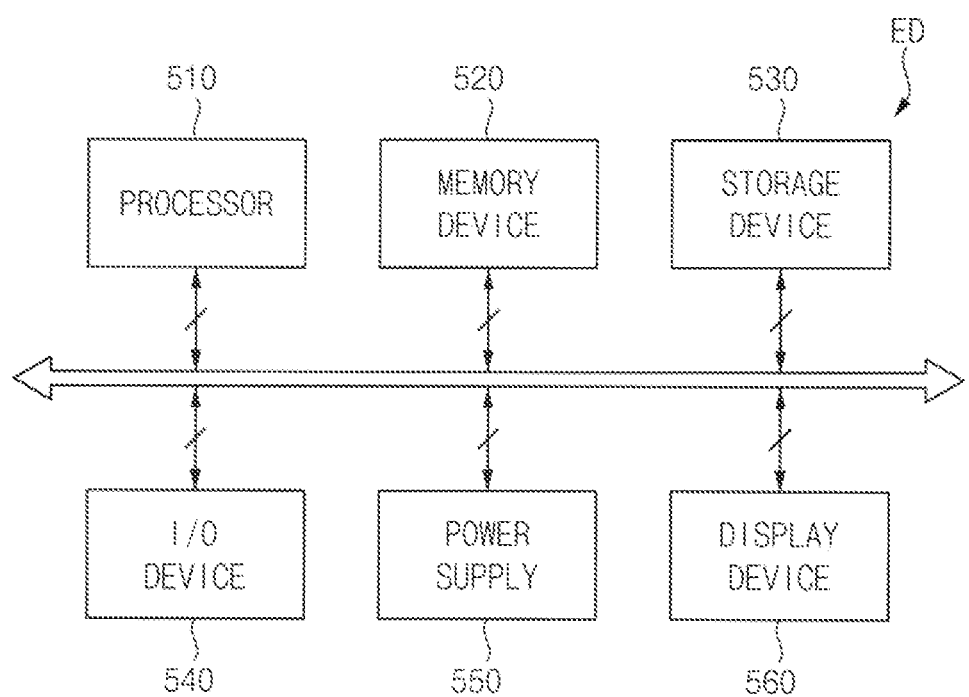
FIG. 5 is a block diagram illustrating an electronic device according to an embodiment of the present inventive concept.
Figure 6:
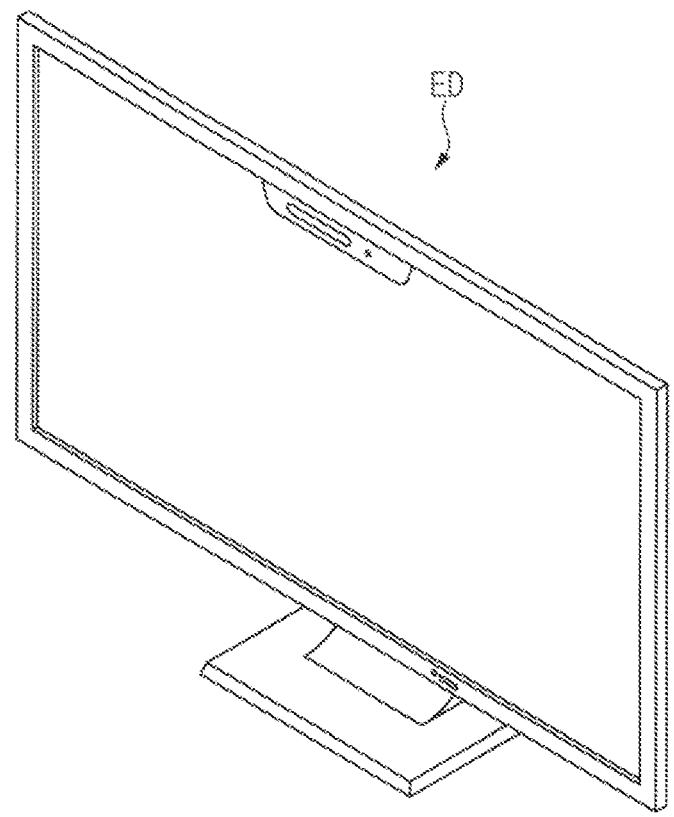
FIG. 6 is a diagram illustrating an embodiment in which the electronic device of FIG. 5 is implemented as a computer monitor according to an embodiment of the present inventive concept.
Figure 7:
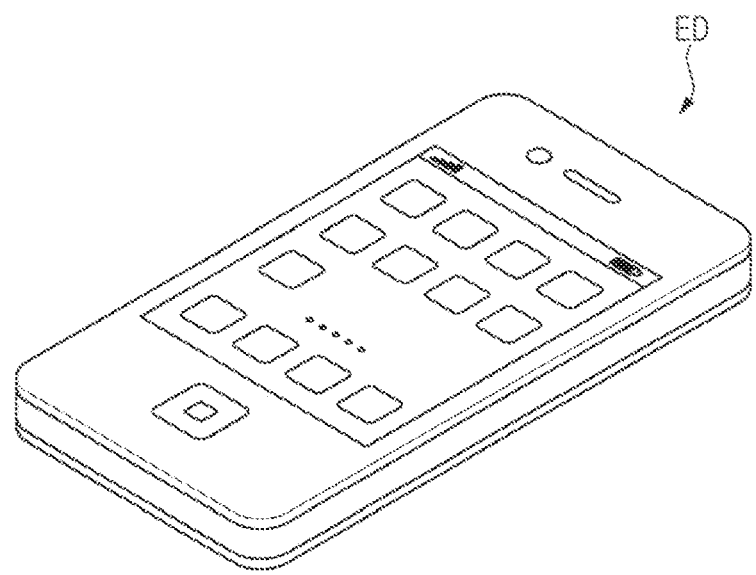
FIG. 7 is a diagram illustrating an embodiment in which the electronic device of FIG. 5 is implemented as a smartphone according to an embodiment of the present inventive concept.

FIG. 5 is a block diagram illustrating an electronic device according to an embodiment. FIG. 6 is a diagram illustrating an embodiment in which the electronic device of FIG. 5 is implemented as a computer monitor. FIG. 7 is a diagram illustrating an embodiment in which the electronic device of FIG. 5 is implemented as a smartphone.

Referring to FIGS. 5-7, an embodiment of an electronic device ED may include a processor 510, a memory device 520, a storage device 530, an input/output device 540, a power supply 550, and a display device 560. In such an embodiment, the display device 560 may correspond to the display device DD described above with reference to FIGS. 1-3. The electronic device ED may further include several ports capable of communicating with a video card, a sound card, a memory card, a USB device, and the like. In an embodiment, as illustrated in FIG. 6, the electronic device ED may be implemented as a computer monitor. However, embodiments of the present inventive concept are not necessarily limited thereto. For example, in an embodiment, as illustrated in FIG. 7, the electronic device DD may be implemented as a smartphone. However, embodiments of the present inventive concept are not necessarily limited thereto and in some embodiments the electronic device ED may be a mobile phone, a video phone, a smart pad, a smart watch, a tablet PC, a vehicle navigation system, a computer monitor, notebook computer, head mounted display ("HMD"), etc.

The processor 510 may perform specific calculations or tasks. In an embodiment, the processor 510 may be a micro processor, a central processing unit ("CPU"), an application processor ("AP"), or the like. The processor 510 may be connected to other components through an address bus, a control bus, a data bus, or the like. In an embodiment, the processor 510 may also be connected to an expansion bus such as a peripheral component interconnect ("PCI") bus.

The memory device 520 may store data used for the operation of the electronic device ED. In an embodiment, for example, the memory device 520 may include nonvolatile memory device such as an erasable programmable read-only memory ("EPROM") device, an electrically erasable programmable read-only memory ("EEPROM") device, a flash memory device, and a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, and/or volatile memory device such as a dynamic random access memory ("DRAM") device, a static random access memory ("SRAM") device, a mobile DRAM device.

In an embodiment, the storage device 530 may include a solid state drive ("SSD"), a hard disk drive ("HDD"), a CD-ROM, or the like. The input/output device 540 may include an input means such as a keyboard, a keypad, a touch pad, a touch screen, and a mouse, and an output means such as a speaker and a printer.

In an embodiment, the power supply 550 may supply power required for the operation of the electronic device ED. The display device 560 may be coupled to other components via buses or other communication links. In an embodiment, the display device 560 may be included in the input/output device 540.

Although certain non-limiting embodiments and implementations have been described herein, other embodiments and modifications will be apparent from this description. Accordingly, embodiments of the present inventive concept are not necessarily limited to such embodiments.

What is claimed is:

1. A display device, comprising:
   a substrate comprising a driving element and a light emitting element electrically connected to the driving element;
   a window layer disposed on the substrate;
   a first adhesive layer disposed on the window layer, the first adhesive layer comprising a magnesium compound comprising $MgF_2$ and MgO and an yttrium compound comprising YOF;
   a second adhesive layer disposed on the first adhesive layer; and
   a refractive layer disposed on the second adhesive layer, the refractive layer comprising a perfluoropolyether (PFPE) compound.

2. The display device of claim 1, wherein YOF has a cubic shape, a tetragonal shape, or a rhombohedral shape.

3. The display device of claim 1, wherein the second adhesive layer comprises a substitutional solid solution of $SiO_2$ and $Al_2O_3$.

4. The display device of claim 3, wherein the substitutional solid solution is $Si_9Al_2O_{10}$.

5. The display device of claim 1, wherein:
   a refractive index of the first adhesive layer is in a range of about 1.38 to about 1.40;
   a refractive index of the second adhesive layer is in a range of about 1.46 to about 1.50; and
   a refractive index of the refractive layer is in a range of about 1.30 to about 1.34.

6. The display device of claim 5, wherein:
   a thickness of the first adhesive layer is in a range of about 50 nm to about 150 nm;
   a thickness of the second adhesive layer is in a range of about 5 nm to about 25 nm; and
   a thickness of the refractive layer is in a range of about 5 nm to about 30 nm.

7. The display device of claim 1, further comprising:
   a color filter layer disposed between the substrate and the window layer; and
   an adhesion layer disposed between the color filter layer and the window layer.

8. A display device, comprising:
   a substrate comprising a driving element and a light emitting element electrically connected to the driving element;
   a window layer disposed on the substrate;
   a first adhesive layer disposed on the window layer, the first adhesive layer comprising $MgF_2$, MgO, and YOF;
   a second adhesive layer disposed on the first adhesive layer, the second adhesive layer comprising a substitutional solid solution of $SiO_2$ and $Al_2O_3$; and
   a refractive layer disposed on the second adhesive layer, the refractive layer comprising a perfluoropolyether (PFPE) compound.

9. The display device of claim 8, wherein YOF has a cubic shape, a tetragonal shape, or a rhombohedral shape.

10. The display device of claim 8, wherein the substitutional solid solution is $Si_9Al_2O_{10}$.

11. The display device of claim 8, wherein:
    a refractive index of the first adhesive layer is in a range of about 1.38 to about 1.40;
    a refractive index of the second adhesive layer is in a range of about 1.46 to about 1.50; and
    a refractive index of the refractive layer is in a range of about 1.30 to about 1.34.

12. The display device of claim 11, wherein:
a thickness of the first adhesive layer is in a range of about 50 nm to about 150 nm;
a thickness of the second adhesive layer is in a range of about 5 nm to about 25 nm; and
a thickness of the refractive layer is in a range of about 5 nm to about 30 nm.

13. The display device of claim 8, further comprising:
a color filter layer disposed between the substrate and the window layer; and
an adhesion layer disposed between the color filter layer and the window layer.

14. A method of manufacturing a display device, comprising:
forming a window layer on a substrate, the substrate comprising a driving element and a light emitting element electrically connected to the driving element;
forming a first adhesive layer on the window layer, the first adhesive layer comprising $MgF_2$, MgO, and YOF;
forming a second adhesive layer on the first adhesive layer, the second adhesive layer comprising a substitutional solid solution formed by reacting $SiO_2$ and $Al_2O_3$; and
forming a refractive layer on the second adhesive layer, the refractive layer comprising a perfluoropolyether (PFPE) compound.

15. The method of claim 14, wherein the forming of the first adhesive layer comprises reacting $MgF_2$ and $Y_2O_3$.

16. The method of claim 15, wherein the reacting of $MgF_2$ and $Y_2O_3$ is performed at a temperature in a range of about 1150° C. to about 1250° C.

17. The method of claim 15, wherein the reacting of $MgF_2$ and $Y_2O_3$ is performed at a temperature in a range of about 140° C. to 160° C. by providing 02 and Ar.

18. The method of claim 17, wherein:
in the reacting of $MgF_2$ and $Y_2O_3$, $O_2$ is provided at a flow rate of about 5 SCCM to about 30 SCCM, and Ar is provided at a flow rate in a range of about 5 SCCM to about 30 SCCM.

19. The method of claim 14, wherein the substitutional solid solution is $Si_9Al_2O_{10}$, and the reacting $SiO_2$ and $Al_2O_3$ is performed at a temperature in a range of about 1530° C. to about 1590° C.

* * * * *